United States Patent
Burak et al.

(10) Patent No.: US 10,536,133 B2
(45) Date of Patent: Jan. 14, 2020

(54) COMPOSITE SURFACE ACOUSTIC WAVE (SAW) DEVICE WITH ABSORBING LAYER FOR SUPPRESSION OF SPURIOUS RESPONSES

(71) Applicant: Avago Technologies International Sales Pte. Limited, Singapore (SG)

(72) Inventors: Dariusz Burak, Fort Collins, CO (US); Suresh Sridaran, Fort Collins, CO (US); Stephen Roy Gilbert, San Francisco, CA (US); Richard C. Ruby, Menlo Park, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 516 days.

(21) Appl. No.: 15/136,866

(22) Filed: Apr. 22, 2016

(65) Prior Publication Data
US 2017/0310304 A1    Oct. 26, 2017

(51) Int. Cl.
*H03H 9/02* (2006.01)
*H01L 41/047* (2006.01)
*H03H 9/64* (2006.01)
*H01L 41/107* (2006.01)
*H03H 9/25* (2006.01)

(52) U.S. Cl.
CPC ............ *H03H 9/64* (2013.01); *H01L 41/047* (2013.01); *H01L 41/107* (2013.01); *H03H 9/02551* (2013.01); *H03H 9/02559* (2013.01); *H03H 9/02574* (2013.01); *H03H 9/02866* (2013.01); *H03H 9/25* (2013.01)

(58) Field of Classification Search
CPC .................. H03H 9/02535; H03H 9/02574

USPC ...... 310/313 R, 313 A, 313 B, 313 C, 313 D
See application file for complete search history.

(56) References Cited

U.S. PATENT DOCUMENTS

| | | |
|---|---|---|
| 3,887,887 A | 6/1975 | Wagers et al. |
| 4,163,201 A | 7/1979 | Takahashi et al. |
| 4,388,600 A | 6/1983 | Wakino et al. |
| 4,879,487 A | 11/1989 | Sugai et al. |
| 5,235,233 A | 8/1993 | Yamamoto |
| 5,446,330 A | 8/1995 | Eda et al. |
| 5,708,402 A | 1/1998 | Hachisu et al. |
| 6,060,818 A | 5/2000 | Ruby et al. |
| 7,067,956 B2 | 6/2006 | Imai et al. |
| 7,148,769 B2 | 12/2006 | Takano |

(Continued)

FOREIGN PATENT DOCUMENTS

| JP | 05-063500 A | 3/1993 |
|---|---|---|
| JP | 2001-053579 A | 2/2001 |

OTHER PUBLICATIONS

Co-pending U.S. Appl. No. 14/866,273, filed Sep. 26, 2015.

(Continued)

*Primary Examiner* — Derek J Rosenau
(74) *Attorney, Agent, or Firm* — Sheridan Ross P.C.

(57) ABSTRACT

A surface acoustic wave (SAW) device includes: a base substrate; a piezo-electric material layer; at least one interdigitated electrode pair disposed on the piezo-electric material layer; and an acoustic wave suppression layer disposed between the piezo-electric material layer and the base substrate, the acoustic wave suppression layer being configured to suppress an acoustic wave propagating in a direction from the piezo-electric material layer to the base substrate.

14 Claims, 10 Drawing Sheets

(56) References Cited

U.S. PATENT DOCUMENTS

| | | |
|---|---|---|
| 7,213,314 B2 | 5/2007 | Abbott et al. |
| 7,331,092 B2 | 2/2008 | Miura et al. |
| 7,501,912 B2 | 3/2009 | Jamneala et al. |
| 7,504,759 B2 | 3/2009 | Sobu et al. |
| 7,609,129 B2 | 10/2009 | Yokota et al. |
| 7,675,387 B2 | 3/2010 | Sakiyama et al. |
| 7,728,485 B2 | 6/2010 | Handtmann et al. |
| 7,800,464 B2 | 9/2010 | Tajima et al. |
| 7,939,987 B1 | 5/2011 | Solal et al. |
| 8,035,464 B1 | 10/2011 | Abbott et al. |
| 6,060,818 C1 | 12/2011 | Ruby et al. |
| 8,149,500 B2 | 4/2012 | Godshalk et al. |
| 8,390,397 B2 | 3/2013 | Jamneala et al. |
| 8,587,391 B2 | 11/2013 | Gilbert et al. |
| 8,664,835 B2 | 3/2014 | Matsuda et al. |
| 8,866,365 B2 | 10/2014 | Hori et al. |
| 8,946,904 B2 | 2/2015 | Railkar et al. |
| 8,997,320 B2 | 4/2015 | Fuyutsume et al. |
| 9,243,316 B2 | 1/2016 | Larson, III et al. |
| 9,391,666 B1 | 7/2016 | Handtmann et al. |
| 9,991,870 B2 | 6/2018 | Gilbert et al. |
| 2003/0022412 A1 | 1/2003 | Higgins et al. |
| 2003/0199105 A1 | 10/2003 | Kub |
| 2004/0226162 A1 | 11/2004 | Miura |
| 2005/0088257 A1 | 4/2005 | Ruby et al. |
| 2006/0043822 A1 | 3/2006 | Yokota |
| 2007/0120623 A1 | 5/2007 | Sakiyama et al. |
| 2007/0296304 A1* | 12/2007 | Fujii ............ H03H 3/10 310/313 A |
| 2008/0024037 A1 | 1/2008 | Tamura |
| 2008/0106354 A1 | 5/2008 | Kando |
| 2008/0169724 A1* | 7/2008 | Bhattacharjee .... H03H 9/02574 310/313 B |
| 2010/0141086 A1* | 6/2010 | Suzuki ............ H03H 3/10 310/313 A |
| 2014/0132117 A1 | 5/2014 | Larson, III |
| 2014/0145558 A1 | 5/2014 | Hori et al. |
| 2014/0227434 A1 | 8/2014 | Iwamoto |
| 2014/0320234 A1 | 10/2014 | Takemura |
| 2015/0069882 A1 | 3/2015 | Umeda et al. |
| 2015/0171823 A1 | 6/2015 | Brawley |
| 2015/0244346 A1 | 8/2015 | Feng et al. |
| 2017/0063329 A1 | 3/2017 | Gilbert et al. |
| 2017/0063330 A1 | 3/2017 | Gilbert et al. |
| 2017/0063331 A1 | 3/2017 | Gilbert et al. |
| 2017/0063332 A1 | 3/2017 | Gilbert et al. |
| 2017/0063333 A1 | 3/2017 | Gilbert et al. |
| 2017/0063338 A1 | 3/2017 | Gilbert et al. |
| 2017/0063339 A1 | 3/2017 | Burak et al. |
| 2017/0085247 A1 | 3/2017 | Ruby et al. |
| 2017/0222619 A1 | 8/2017 | Iwamoto |
| 2017/0250673 A1 | 8/2017 | Ruby et al. |
| 2017/0302251 A1 | 10/2017 | Ruby et al. |

OTHER PUBLICATIONS

Co-pending U.S. Appl. No. 14/866,394, filed Sep. 26, 2015.
Co-pending U.S. Appl. No. 15/009,801, filed Jan. 28, 2016.
English language machine translation of JP 2001-053579 A, published Feb. 23, 2001, 7 pages.
English language machine translation of JP 05-063500 A, published Mar. 12, 1993, 3 pages.

* cited by examiner

COMPOSITE SURFACE ACOUSTIC WAVE (SAW) DEVICE WITH ABSORBING LAYER FOR SUPPRESSION OF SPURIOUS RESPONSES

BACKGROUND

Surface acoustic wave (SAW) devices are widely employed for resonators, bandpass filters, duplexers, and transformers in RF and microwave communication devices, such as mobile telephones.

Figure 1:
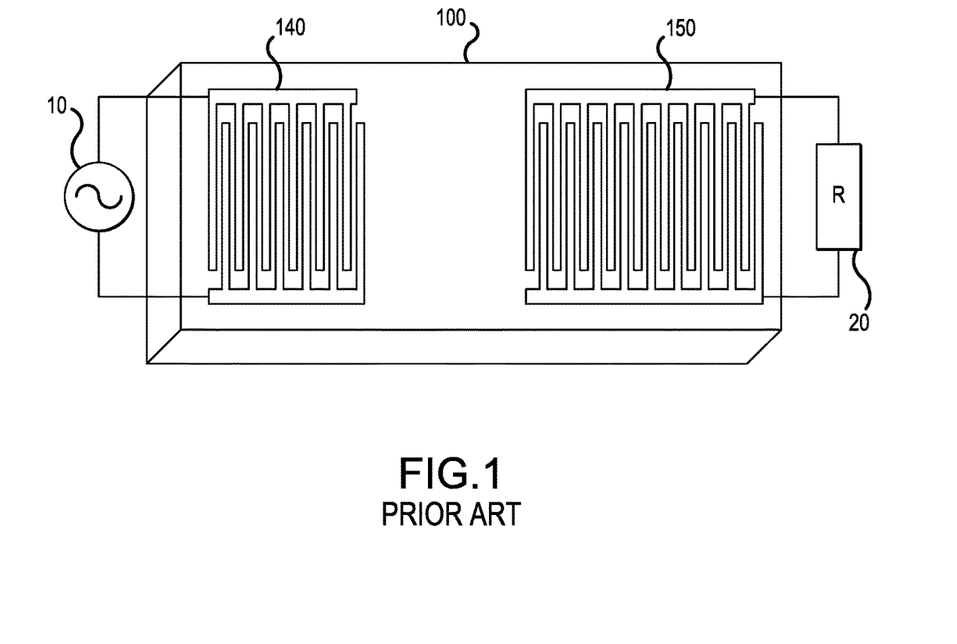
FIG. 1 is a schematic illustration of a SAW device.

FIG. 1 is a schematic illustration of a SAW device 100. SAW device 100 includes first and second interdigitated transducer (IDT) electrode pairs 140 and 150 formed on a piezo-electric substrate. A surface acoustic wave may be excited by signal generator 10 applying an electrical signal across IDT electrode pair 140. A load 20 is provided as shown. Electrical signals are correspondingly generated across IDT electrode pair 150 from the passing surface acoustic waves.

Figure 2:
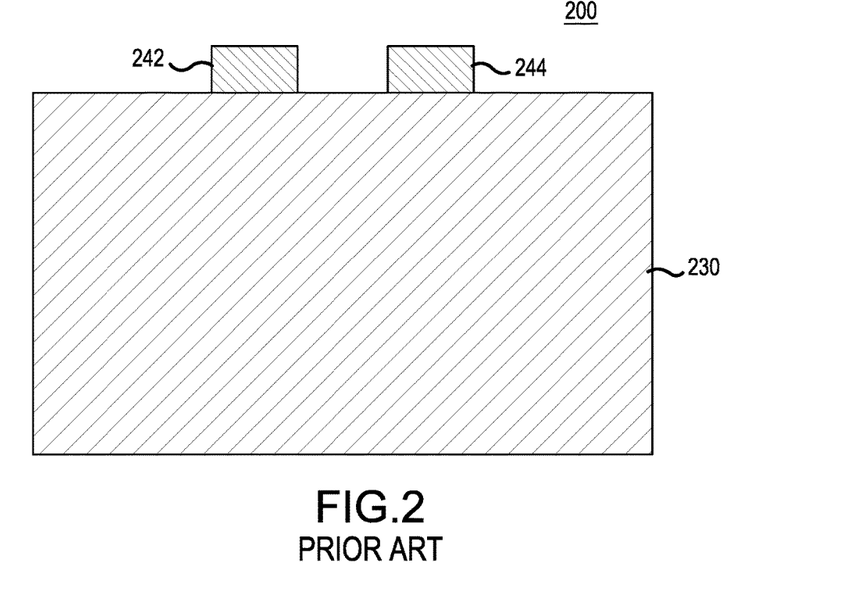
FIG. 2 illustrates a cross-section of a portion of an example of a SAW device.

FIG. 2 illustrates a cross-section of a portion of an example of a SAW device 200. SAW device 200 includes a base substrate 230 and first and second electrodes 242 and 244 disposed on a top of base substrate 230. Base substrate 230 is made of a piezo-electric material, such as lithium tantalite (LiTaO3—hereinafter simply referred to as LT) or lithium niobate (LiNbO3—hereinafter simply referred to as LN), for example. First and second electrodes 242 and 244 comprise an electrically conductive material such as gold or aluminum, and may be part of an IDT electrode pair as illustrated in FIG. 2. Notably, first and second electrodes 242 and 244 represent only one pair of a plurality of electrodes 140 or 150 forming an IDT electrode pair shown in FIG. 1. The operation of SAW devices is well known to those skilled in the art, and therefore will not be reiterated here.

Higher performance is continuously being sought for SAW devices as the performance requirements of the devices in which they are embedded become more demanding. For example, in recent years it has been desired to provide SAW devices with enhanced temperature stability, because changes in frequency can altar the frequency characteristics of a SAW device. In particular, for a SAW filter, changes in temperature may altar the pass-band frequency range of the SAW filter.

As is known, piezo-electric materials having a large electromechanical coupling coefficient are advantageous for realizing broad filter characteristics. LT and LN are examples of piezo-electric materials having a large electromechanical coupling coefficient. However, the temperature stability of LT and LN leaves something to be desired. There seems to be a general tendency of incompatible characteristics such that piezo-electric materials having large electromechanical coupling coefficients such as LT and LN have comparatively poor temperature stability, while piezo-electric materials having good temperature stability, such as quartz crystal, have comparatively small electromechanical coupling coefficients.

Accordingly, SAW devices have been developed which employ hybrid or composite substrate structures.

Figure 3:
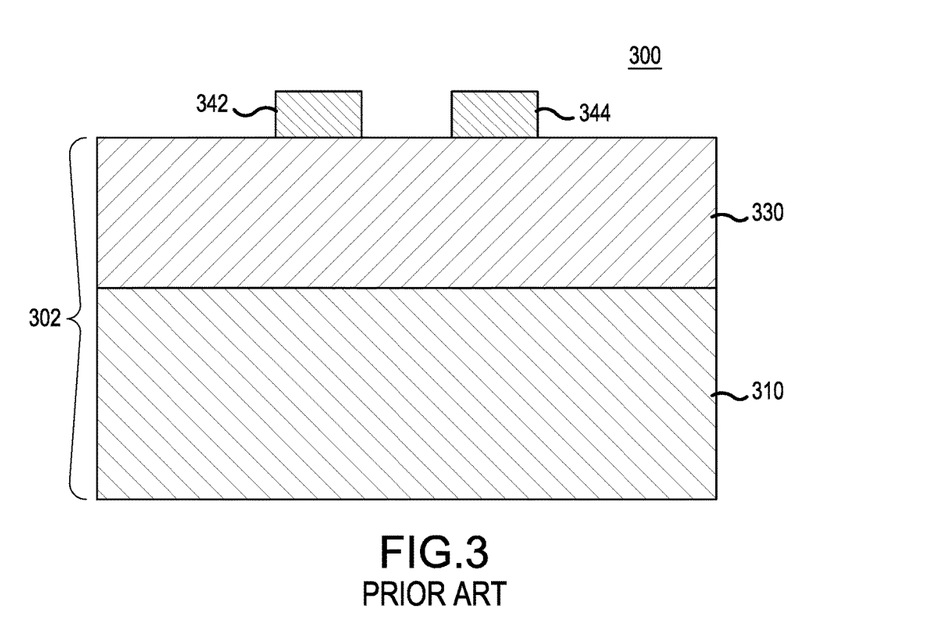
FIG. 3 illustrates a cross-section of a portion of an example of a SAW device having a composite substrate.

FIG. 3 illustrates a cross-section of a portion of an example of a SAW device 300 having a so-called composite substrate 302. In particular, SAW device 300 includes composite substrate 302 comprising a base substrate 310 of a first material, and a piezo-electric material layer 330 disposed on and immediately adjacent to base substrate 310. SAW device further includes first and second electrodes 342 and 344 disposed on a top of piezo-electric material layer 330.

Piezo-electric material layer 330 is made of a piezo-electric material, and beneficially a piezo-electric material having a large electromechanical coupling coefficient, such as LT or LN. Base layer 310 is made of a different material than piezo-electric material layer 330, and beneficially is a material having a relatively low-coefficient-of-thermal-expansion—at least lower than that of piezo-electric material layer 330. First and second electrodes 342 and 344 comprise an electrically conductive material such as gold or aluminum, and may be part of a pair of interdigitated transducers by which a signal is propagated from an input transducer to an output transducer.

Overall, when compared to SAW 200, SAW 300 may exhibit some tangible benefits such as improved thermal performance, some temperature compensation, and an improved quality factor ("Q") below its fundamental operating frequency.

Unfortunately, however, in general a SAW device having the general structure of SAW device 300 with its composite substrate 302 is typically prone to exhibiting spurious responses or "rattles" at frequencies above its series resonance frequency, Fs.

Figure 4:
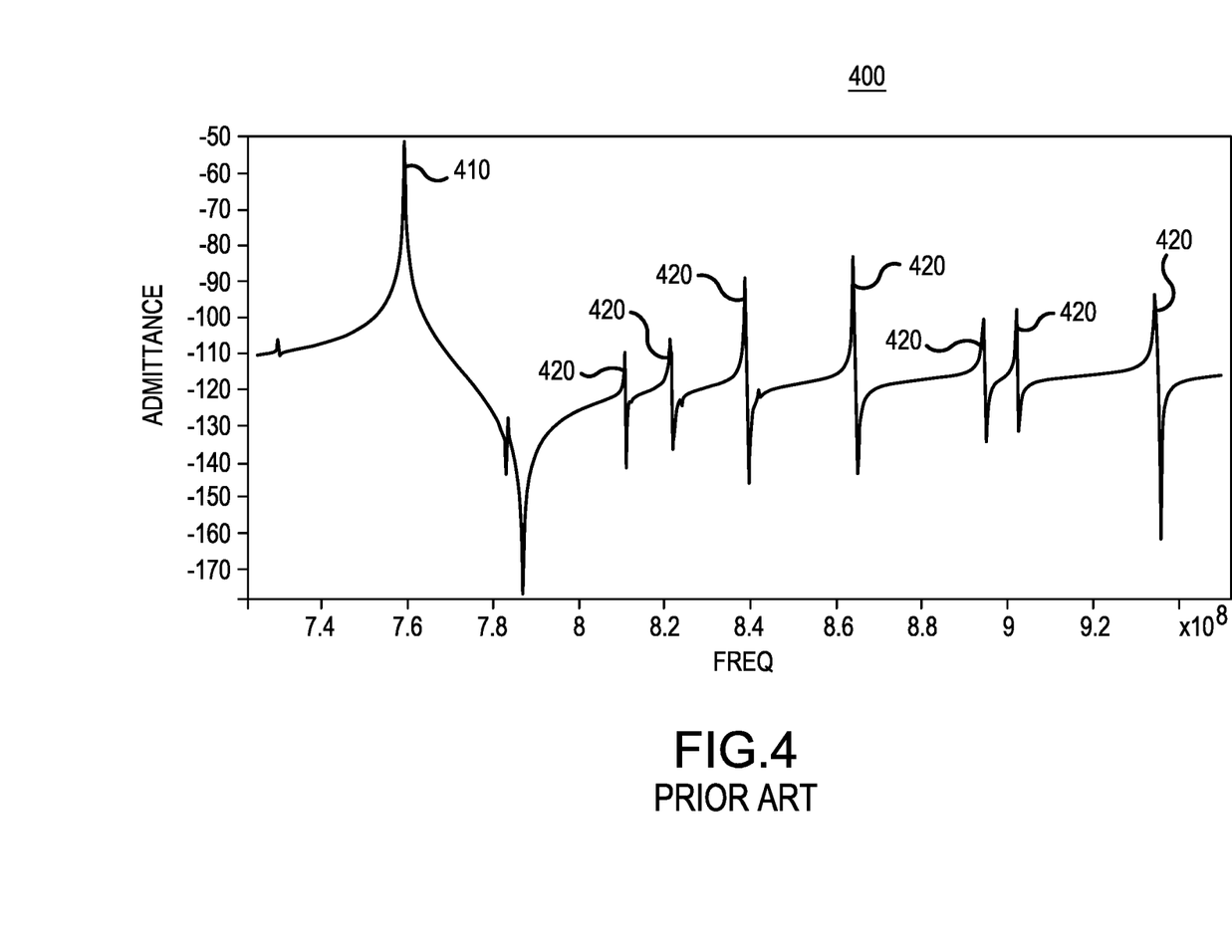
FIG. 4 plots an example of the global admittance frequency response for an example SAW device.

For example, FIG. 4 plots an example of the simulated global admittance frequency response for an example of SAW device 300 where piezo-electric material layer 330 comprises LT and has a thickness of 20 μm, and base substrate 310 comprises silicon (Si) having a thickness of 20 μm or more. As seen in FIG. 4, the admittance frequency response has a peak 410 at a series resonance frequency, Fs, of about 759 MHz, which is the desired response. However, the admittance frequency response also has a number of spurious responses or "rattles" 420 at frequencies above Fs.

These spurious responses or "rattles" are undesirable. For example, if the SAW device is a bandpass filter, then any undesired signals which fall on a frequency of one of the spurious responses may pass through the SAW filter without the desired level of attenuation.

What is needed, therefore, are SAW devices which may exhibit a large electromechanical coupling coefficient, good temperature stability, and low levels of spurious responses or "rattles."

SUMMARY

In one aspect of the inventive concept, a surface acoustic wave (SAW) device comprises: a base substrate; a piezo-electric material layer; at least one interdigitated electrode pair disposed on the piezo-electric material layer; and an acoustic wave suppression layer disposed between the piezo-electric material layer and the base substrate, the acoustic wave suppression layer being configured to suppress an acoustic wave propagating in a direction from the piezo-electric material layer to the base substrate.

In one or more embodiments, the piezo-electric material layer has a first shear velocity, and the base substrate has a second shear velocity, and the acoustic wave suppression layer has a third shear velocity which is less than the first shear velocity and less than the second shear velocity.

In one or more embodiments, the acoustic wave suppression layer comprises a dielectric layer.

In one or more embodiments, the acoustic wave suppression layer comprises at least one of a silicon low-k resin and carbon doped silicon oxide.

In one or more embodiments, the acoustic wave suppression layer comprises a doped piezo-electric material layer, doped with an impurity which causes a viscous loss to the acoustic wave propagating in the direction from the piezo-electric material layer to the base substrate.

In one or more embodiments, the impurity comprises hydrogen or oxygen.

In one or more embodiments, the base substrate comprises one of silicon or sapphire.

In one or more embodiments, the piezo-electric material layer comprises one of $LiNbO_3$ or $LiTaO_3$.

In one or more embodiments, the SAW device further comprises: a temperature compensating material layer disposed: between the at least one interdigitated electrode pair and the piezo-electric material layer, or on the at least one interdigitated electrode pair and the piezo-electric material layer.

In another aspect of the inventive concept, a surface acoustic wave (SAW) device comprises: a base substrate, comprising silicon or sapphire; an acoustic wave absorbing layer disposed on the base substrate; a piezo-electric material layer disposed on the acoustic wave absorbing layer, the piezo-electric material layer comprising $LiNbO_3$ or $LiTaO_3$; and at least one interdigitated electrode pair disposed on the piezo-electric material layer, the electrode pair comprising an electrically conductive material, wherein the acoustic wave absorbing layer comprises a material having properties to substantially trap within the acoustic wave absorbing layer an acoustic wave propagating in a direction from the piezo-electric material layer to the base substrate.

In one or more embodiments, the piezo-electric material layer has a first shear velocity, and the base substrate has a second shear velocity, and the acoustic wave absorbing layer has a third shear velocity which is less than the first shear velocity and less than the second shear velocity.

In one or more embodiments, the acoustic wave absorbing layer comprises a dielectric layer.

In one or more embodiments, the acoustic wave suppression layer comprises at least one of a silicon low-k resin and carbon doped silicon oxide.

In one or more embodiments, the SAW device further includes an undoped silicon glass (USG) layer disposed: between the at least one interdigitated electrode pair and the piezo-electric material layer, or on the at least one interdigitated electrode pair and the piezo-electric material layer.

In another aspect of the inventive concept, a method of producing a surface acoustic wave (SAW) device comprises: providing a base substrate; an acoustic wave suppression layer and a piezo-electric material layer on the base substrate, wherein the acoustic wave suppression layer is provided between the piezo-electric material layer and the base substrate; and forming at least one interdigitated electrode pair on the piezo-electric material layer, wherein the acoustic wave suppression layer is configured to suppress an acoustic wave propagating in a direction from the piezo-electric material layer to the base substrate.

In one or more embodiments, the base substrate comprises one of silicon or sapphire.

In one or more embodiments, the acoustic wave suppression layer comprises at least one of a silicon low-k resin and carbon doped silicon oxide.

In one or more embodiments, doping the acoustic wave suppression layer and the piezo-electric material layer on the base substrate comprises doping the piezo-electric material layer with an impurity which causes a viscous loss to the acoustic wave propagating in the piezo-electric material layer to produce the acoustic wave suppression layer; and bonding the piezo-electric material layer having the acoustic wave suppression layer formed thereon to the base substrate such that the acoustic wave suppression layer is disposed between the piezo-electric material layer and the base substrate.

In one or more embodiments, doping the piezo-electric material layer to produce the acoustic wave suppression layer comprises implanting hydrogen or oxygen from a backside of the piezo-electric material layer.

In one or more embodiments, providing the acoustic wave suppression layer and the piezo-electric material layer on the base substrate comprises: depositing the acoustic wave suppression layer on the base substrate; and bonding the piezo-electric material layer to the base substrate having the acoustic wave suppression layer disposed thereon.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIGS. 8A, 8B, 8C and 7D are cross-sectional views illustrating another embodiment of a method of making a SAW device having an acoustic wave suppression layer.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to within acceptable limits or degree.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same. As used in the specification and the appended claims and in addition to its ordinary meaning, the term 'about' means to within 10%.

Generally, it is understood that the drawings and the various elements depicted therein are not drawn to scale. Further, relative terms, such as "above," "below," "top," "bottom," "upper" and "lower" may be used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

Without wishing to be bound by any specific theory, the present inventors have theorized that formation of the spurious responses or "rattles" above-Fs as described above with respect to FIG. 4 can be explained in terms of lost surface confinement of energy as frequency increases above a certain cut-off frequency under the periodic voltage driving conditions. Acoustic waves propagating into the piezo-electric material layer experiences constructive/destructive interference with waves reflected from piezo/base substrate interface (e.g., LT/Si interface), forming rattles in the S-chart. Moreover, for a silicon substrate, total internal reflection occurs at the LT/Si interface, preventing the energy from propagating into the Si substrate. Notably, if acoustic energy were allowed to propagate into the Si substrate instead of being reflected from the LT/Si interface, it might have then led to weaker rattles, or dissipated rattles.

Figure 5:
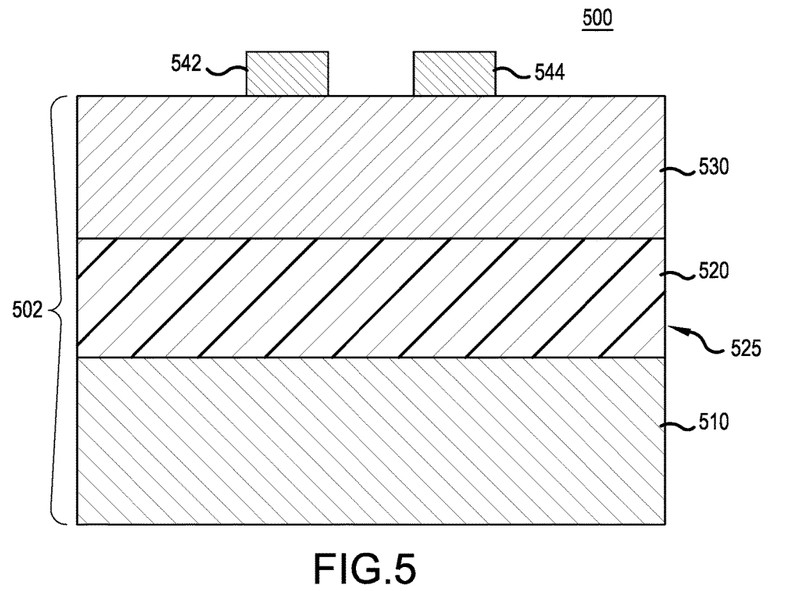
FIG. 5 illustrates a cross-section of a portion of one embodiment of a SAW device having an acoustic wave suppression layer.

FIG. 5 illustrates a cross-section of a portion of one embodiment of a SAW device 500 having an acoustic wave suppression layer. SAW device 500 includes a composite substrate 502, comprising: a base substrate 510; an acoustic wave suppression layer 520 disposed on base substrate 510; and a piezo-electric material layer 530 disposed on acoustic wave suppression layer 520. SAW device 500 also includes at least one interdigitated electrode pair 542/544 disposed on piezo-electric material layer 530.

In some embodiments, base substrate 510 may comprise silicon, sapphire (i.e., $Al_2O_3$), or glass.

In some embodiments, piezo-electric material layer 530 may comprise lithium tantalite ($LiTaO_3$—hereinafter simply referred to as LT) or lithium niobate ($LiNbO_3$—hereinafter simply referred to as LN).

Electrode pair 542/544 may be two fingers of an interdigitated transducer having dozens or even hundreds of "fingers." Electrodes 542 and 544 comprise an electrically conductive material, such as gold or aluminum. The distance D between electrode 542 and electrode 544 may be λ/2, where λ is the wavelength of the acoustic wave in SAW device 500.

Beneficially, acoustic wave suppression layer 520 may comprise a dielectric.

In SAW device 500, acoustic wave suppression layer 520 is an acoustic wave absorbing layer 525, which comprises a material having properties to substantially trap within acoustic wave absorbing layer 525 an acoustic wave propagating in a direction from piezo-electric material layer 530 to the base substrate 510 thereby reducing spurious responses or "rattles." For example, in some embodiments acoustic wave absorbing layer 525 may be selected such that when piezo-electric material layer 530 has a first shear velocity, and base substrate 510 has a second shear velocity, then acoustic wave absorbing layer 525 has a third shear velocity which is less than the first shear velocity and less than the second shear velocity. Accordingly, an acoustic wave which propagates in a direction from piezo-electric material layer 530 toward base substrate 510 may be effectively coupled into acoustic wave absorbing layer 525, but may not be effectively coupled out of acoustic wave absorbing layer 525 into either piezo-electric material layer 530 or base substrate 510, thereby becoming trapped within acoustic wave absorbing layer 525.

In some embodiments, acoustic wave absorbing layer 525 may comprise a silicon low-k resin material, such as SiLK™ semiconductor dielectric resin materials manufactured and marketed by DOW®. In some embodiments, acoustic wave absorbing layer 525 may comprise carbon doped silicon oxide (CDO), for example CDO26 and CDO40. Here, for illustrative purposes CDO26 designates a material layer where a CDO material is deposited onto base substrate 510 (e.g., Si) at a pressure of 2.6 torrs, and CDO40 designates a material layer where a CDO material is deposited onto base substrate 510 at a pressure of 4.0 torrs. Of course other deposition conditions are possible leading to CDO materials with slightly different acoustic characteristics. In other embodiments, other materials may be employed for acoustic wave absorbing layer 525.

U.S. Pat. No. 8,390,397, issued to Jamneala et al. on Mar. 5, 2013, and U.S. Pat. No. 8,587,391 to Gilbert et al., both of which incorporated herein by reference, describe some details regarding methods of producing devices which include SiLK™ and CDO material layers.

Table 1 below lists some estimated characteristics for some materials which may be employed in various embodiments of SAW device 500.

TABLE 1

| Material | Layer | Density | VL (m/s) | VS (m/s) | ZL (MR) | ZS (MR) |
| --- | --- | --- | --- | --- | --- | --- |
| LiTaO$_3$ | Piezo-electric | 7.45 | 6085 | 3568 | 45.3 | 26.6 |
| 42 deg LiTaO$_3$ | Piezo-electric | 7.45 | 5885 | 3393 | 43.8 | 25.3 |
| LiNbO$_3$ | Piezo-electric | 4.63 | 6940 | 3600 | 32.1 | 16.7 |
| Si | Base Substrate | 2.33 | 8437 | 5820 | 19.7 | 13.6 |
| Sapphire | Base Substrate | 3.98 | 10658 | 5796 | 42.4 | 23.1 |
| SiLK | Absorbing Layer | 1.13 | 1960 | 1226 | 2.2 | 1.4 |
| CDO40 | Absorbing Layer | 1.16 | 2334 | 1459 | 2.7 | 1.7 |
| CDO26 | Absorbing Layer | 1.43 | 3737 | 2336 | 5.3 | 3.3 |

In Table 1, VL designates a longitudinal velocity of an acoustic wave in the material, VL designates a shear velocity of an acoustic wave in the material, ZL designates a longitudinal impedance of the material, and ZS designates a shear impedance of the material. The values of acoustic impedances ZL and ZS are provided in mega-Rayls (MR). As can be seen in Table 1, the shear velocities of SiLK, CDO26 and CDO 40 are all less than the shear velocities of silicon, sapphire, LiTaO$_3$, 42 degree LiTaO$_3$, and LiNbO$_3$.

In beneficial embodiments, acoustic wave absorbing layer 525 may have a shear velocity (VS) greater than about 1.7 km/sec. and a shear impedance (ZS) greater than about 1.7 MR.

In some embodiments, piezo-electric material layer 530 (e.g., LN) may have a thickness of about 10 µm, acoustic wave absorbing layer 525 (e.g., CDO) may have a thickness of about 10 µm, and base substrate 510 (e.g., Si) may have a thickness of about 20 µm or more. Other embodiments may have other thicknesses.

Figure 6:
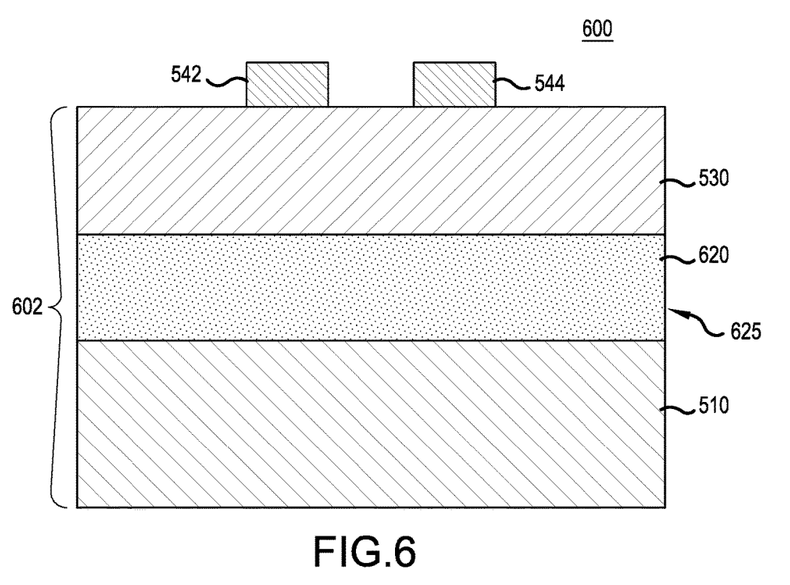
FIG. 6 illustrates a cross-section of a portion of another embodiment of a SAW device having an acoustic wave suppression layer.

FIG. 6 illustrates a cross-section of a portion of another embodiment of a SAW device 600 having an acoustic wave suppression layer. SAW device 600 includes a composite substrate 602, comprising: base substrate 510 and a piezo-electric material layer 530 with a bottom portion of it forming an acoustic wave suppression layer 620, disposed on base substrate 510. SAW device 600 also includes at least one interdigitated electrode pair 542/544 disposed on piezo-electric material layer 530.

Base substrate 510, piezo-electric material layer 530, and electrode pair 542/544 may be the same as shown in FIG. 5 and described above, and so a description thereof will not be repeated.

In SAW device 600, acoustic wave suppression layer 620 comprises a doped piezo-electric material layer 625, doped with an impurity which causes a viscous loss to an acoustic wave propagating in the direction from piezo-electric material layer 530 to base substrate 510. In particular, doped piezo-electric material layer 625 may comprise a lower portion of piezo-electric material layer 530 (e.g., LiTaO$_3$) which has been doped with one or more impurities which may significantly increase the viscous loss of the piezo-material without substantially impacting its density or the acoustic velocity on the material such that energy from an acoustic wave propagating in the direction from piezo-electric material layer 530 to base substrate 510 may be absorbed, thereby reducing spurious responses or "rattles." In some embodiments, the impurity may comprise oxygen or hydrogen.

FIGS. 7A, 7B, 7C and 7D are cross-sectional views illustrating one embodiment of a method of making a SAW device 700 having an acoustic wave suppression layer. Here, SAW device 700 may be one version or variation of SAW device 500.

Figure 7A:
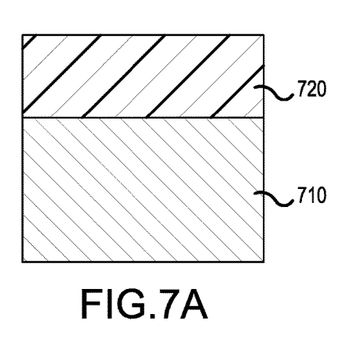
FIGS. 7A, 7B, 7C and 7D are cross-sectional views illustrating one embodiment of a method of making a SAW device having an acoustic wave suppression layer.

As illustrated in FIG. 7A, a base substrate 710 is provided, and an acoustic wave suppression layer 720 is formed on base substrate 710. Here, base substrate 710 may be the same as base substrate 510 described above, and acoustic wave suppression layer 720 may be the same as acoustic wave suppression layer 520 and acoustic wave absorbing layer 525 described above.

Figure 7B:
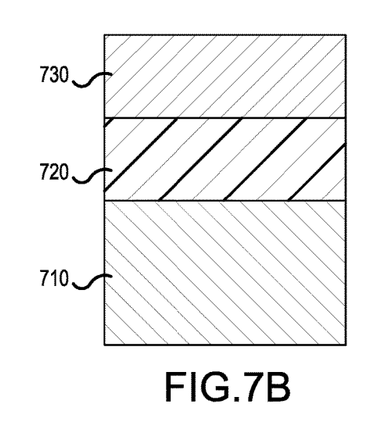

FIG. 7B illustrates bonding a piezo-electric material layer 730 to the acoustic wave suppression layer 720 and base substrate 710. Here, piezo-electric material layer 730 may be the same as piezo-electric material layer 530 described above.

Figure 7C:
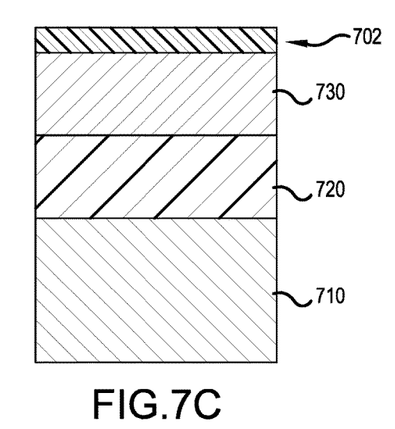

FIG. 7C illustrates forming a temperature compensating material layer 702 on piezo-electric material layer 730. Temperature compensating material layer 702 may provide some temperature compensation for piezo-electric material layer 730. In some embodiments, temperature compensating material layer 702 may be an undoped silicon glass (USG) material layer.

Figure 7D:
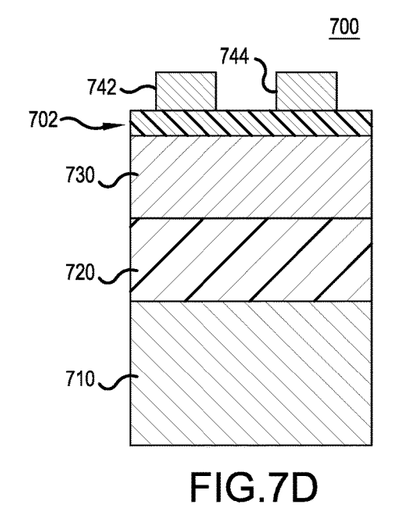

FIG. 7D illustrates forming at least one interdigitated electrode pair 742 and 744 on temperature compensating material layer 702 and piezo-electric material layer 730.

FIGS. 8A, 8B, 8C and 7D are cross-sectional views illustrating another embodiment of a method of making a SAW device 800 having an acoustic wave suppression layer. Here, SAW device 800 may be one version or variation of SAW device 500.

Figure 8A:
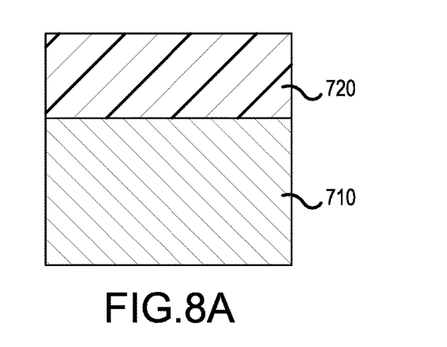
Figure 8B:
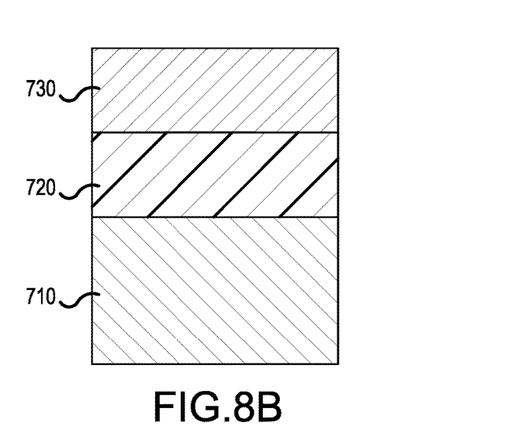

Operations illustrated in FIGS. 8A and 8B are the same as the operations illustrated in FIGS. 7A and 7B above and do descriptions thereof will not be repeated.

Figure 8C:
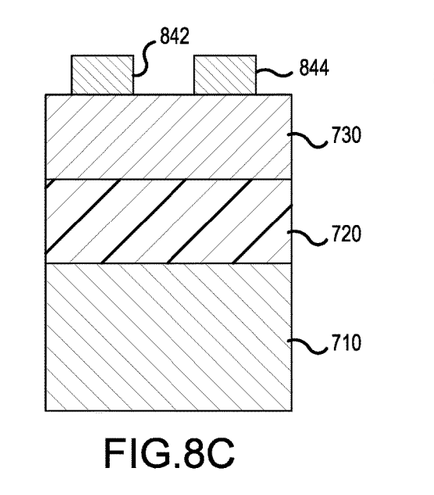

FIG. 8C illustrates forming at least one interdigitated electrode pair 842 and 844 on piezo-electric material layer 730.

Figure 8D:
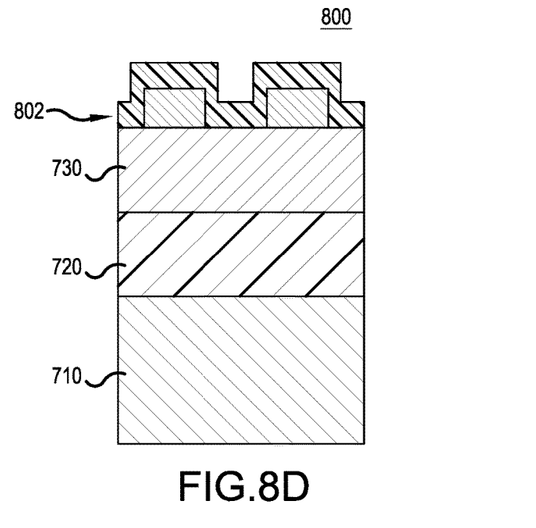

FIG. 8D illustrates forming a temperature compensating material layer 802 on interdigitated electrode pair 842 and 844 and piezo-electric material layer 730. Temperature compensating material layer 802 may provide some temperature compensation for piezo-electric material layer 730. In some embodiments, temperature compensating material layer 802 may be an undoped silicon glass (USG) material layer.

FIGS. 9A, 9B, 9C and 9D are cross-sectional views illustrating yet another embodiment of a method of making a SAW device 900 having an acoustic wave suppression layer. Here, SAW device 900 may be one version or variation of SAW device 600.

Figure 9A:
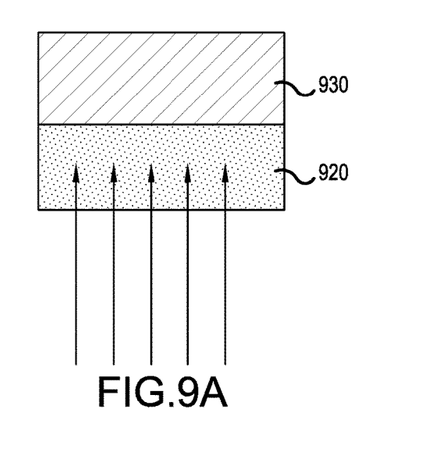
FIGS. 9A, 9B, 9C and 9D are cross-sectional views illustrating yet another embodiment of a method of making a SAW device having an acoustic wave suppression layer.

FIG. 9A illustrates a process of forming an acoustic wave suppression layer 920 on a backside of a piezo-electric material layer 930. Here, acoustic wave suppression layer 920 may be the same as acoustic wave suppression layer 620. In particular, FIG. 9A illustrates an operation of implanting an impurity into the backside of the piezo-electric material layer 930 to produce acoustic wave suppression layer 920 as a doped piezo-electric material layer such as doped piezo-electric material layer 625 described above. In some embodiments, the impurity may comprise oxygen or hydrogen.

Figure 9B:
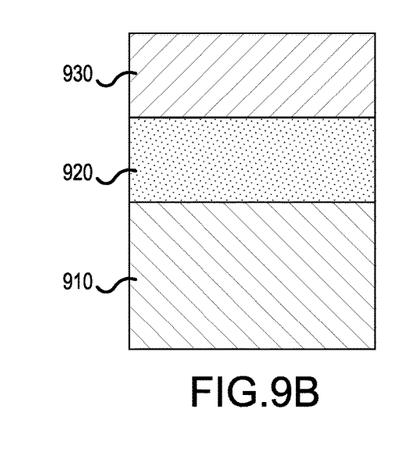

As illustrated in FIG. 9B, a base substrate 910 is provided, and a piezo-electric material layer 930 is bonded to base substrate 910. Here, base substrate 910 may be the same as base substrate 510 described above, and, piezo-electric material layer 930 may be the same as piezo-electric material layer 530 described above.

Methods of bonding a piezo-electric material layer (e.g., piezo-electric material layer 930) to a base substrate (e.g., base substrate) are described in co-pending U.S. patent application Ser. No. 14/866,273, filed on 26 Sep. 2015; Ser. No. 14/866,394, filed on 26 Sep. 2015; and Ser. No. 15/009,801 filed on 28 Jan. 2016, all in the names of Stephen Gilbert et al. The entire disclosures of each of these patent applications are hereby incorporated herein by reference.

Figure 9C:
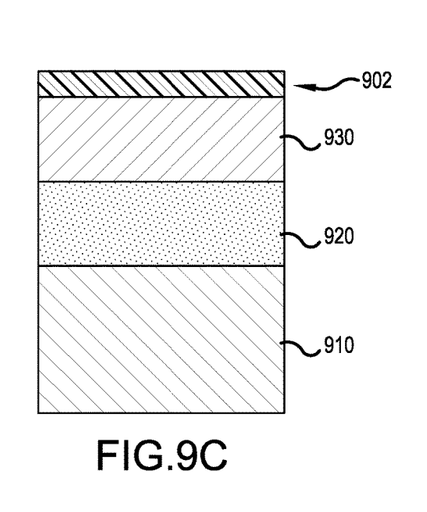

FIG. 9C illustrates forming a temperature compensating material layer 902 on piezo-electric material layer 930. Temperature compensating material layer 902 may provide some temperature compensation for piezo-electric material layer 930. In some embodiments, temperature compensating material layer 902 may be an undoped silicon glass (USG) material layer.

Figure 9D:
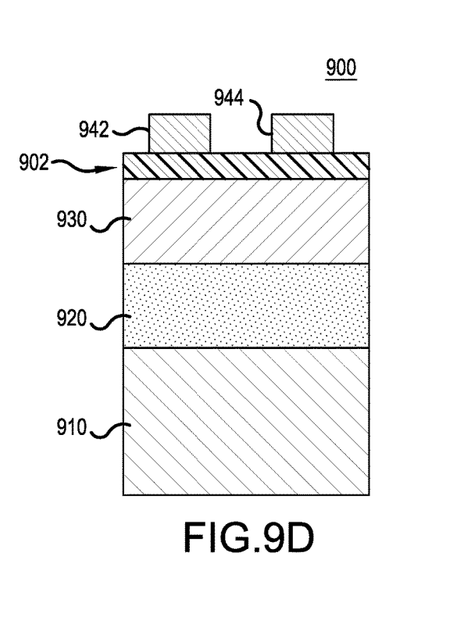

FIG. 9D illustrates forming at least one interdigitated electrode pair 942 and 944 on temperature compensating material layer 902 and piezo-electric material layer 930.

FIGS. 10A, 10B, 10C and 10D are cross-sectional views illustrating still another embodiment of a method of making a SAW device 1000 having an acoustic wave suppression layer. Here, SAW device 1000 may be one version or variation of SAW device 600.

Figure 10A:
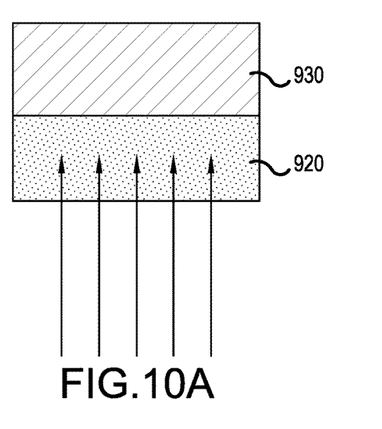
FIGS. 10A, 10B, 10C and 10D are cross-sectional views illustrating still another embodiment of a method of making a SAW device having an acoustic wave suppression layer.
Figure 10B:
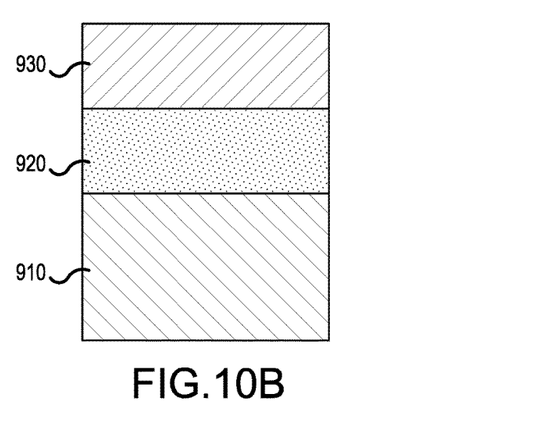

Operations illustrated in FIGS. 10A and 10B are the same as the operations illustrated in FIGS. 9A and 9B above and do descriptions thereof will not be repeated.

Figure 10C:
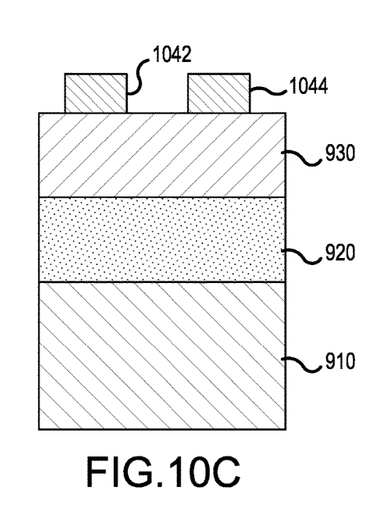

FIG. 10C illustrates forming at least one interdigitated electrode pair 1042 and 1044 on piezo-electric material layer 930.

Figure 10D:
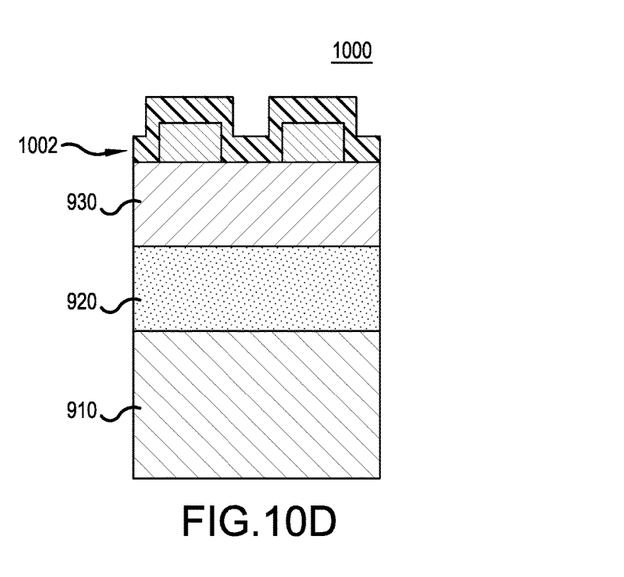

FIG. 10D illustrates forming a temperature compensating material layer 1002 on interdigitated electrode pair 1042 and 1044 and piezo-electric material layer 930. Temperature compensating material layer 1002 may provide some temperature compensation for piezo-electric material layer 930. In some embodiments, temperature compensating material layer 1002 may be an undoped silicon glass (USG) material layer.

Figure 11:
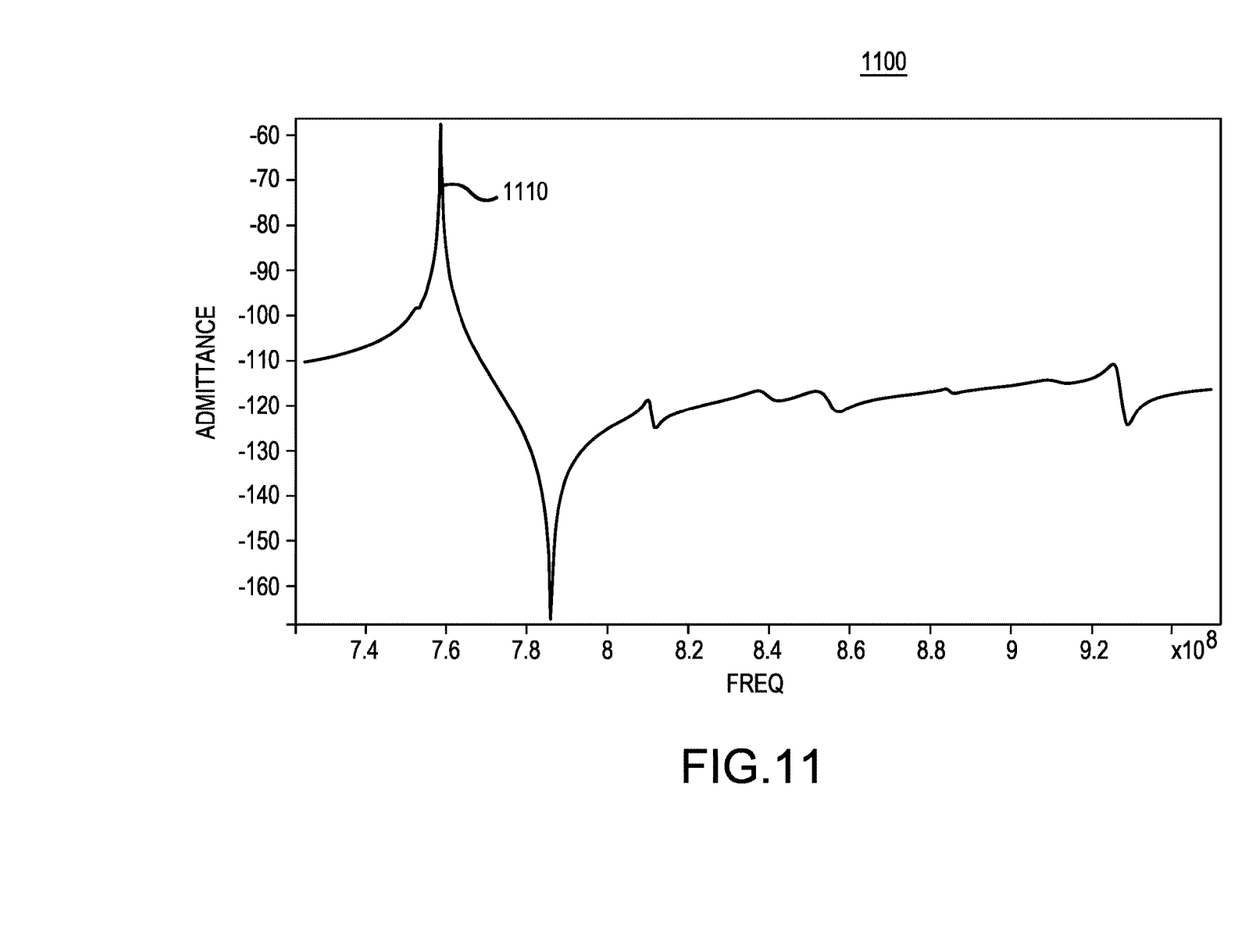
FIG. 11 plots an example of the global admittance frequency response for an example SAW device having an acoustic wave suppression layer.

FIG. 11 plots an example of the simulated global admittance frequency response 1100 for an example SAW device, such as SAW device 500, having an acoustic wave suppression layer as described above.

Figure 12:
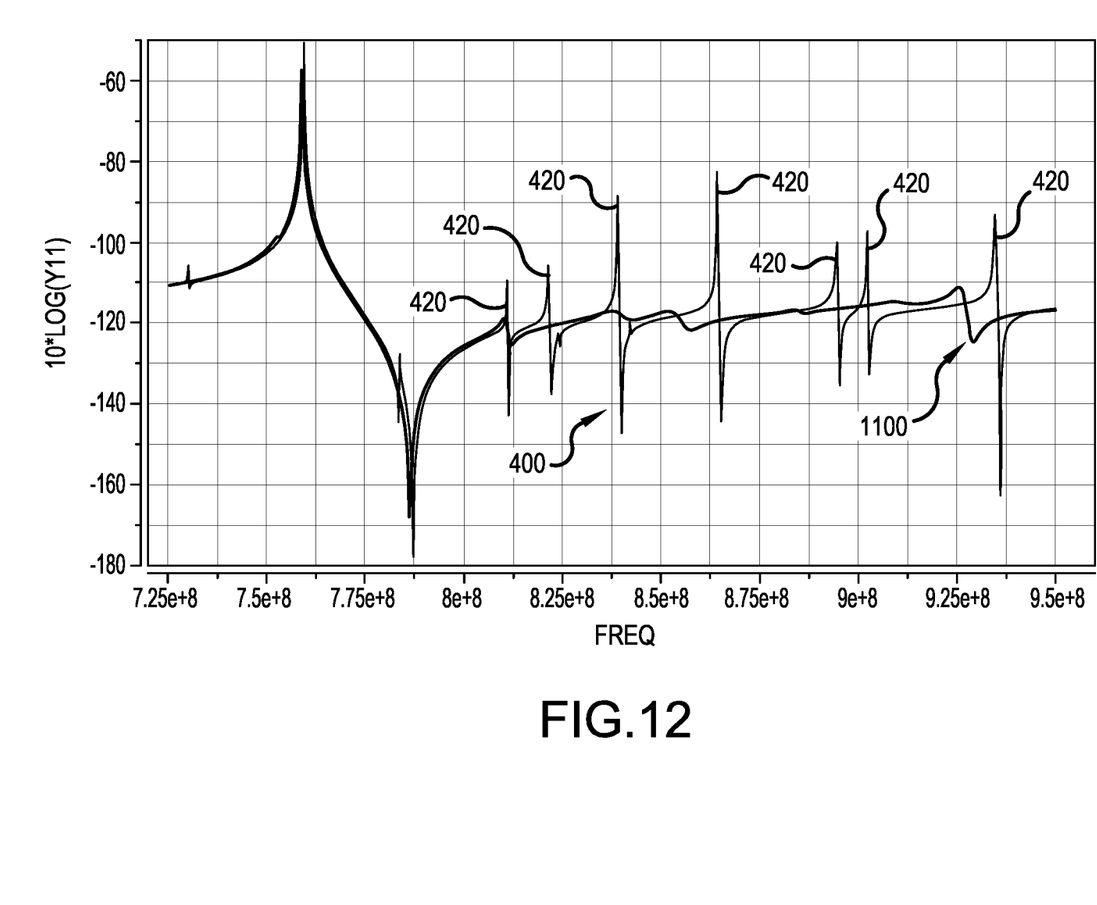
FIG. 12 overlaps the plots of FIGS. 4 and 11.

FIG. 12 overlaps the plots of global admittance frequency response 400 of FIG. 4 and global admittance frequency response 1100 of FIG. 11.

Comparing global admittance frequency response 400 with global admittance frequency response 1100, one can see that the spurious responses or rattles 420 may be completely or substantially eliminated by the addition of an acoustic wave suppression layer between the piezo-electric material layer and the base substrate layer configured to suppress an acoustic wave propagating in a direction from the piezo-electric material layer to the base substrate, as described above. Accordingly, the performance characteristics of an apparatus which includes such a SAW device (e.g., a communication receiver or transceiver in a mobile telephone) may also be enhanced.

While example embodiments are disclosed herein, one of ordinary skill in the art appreciates that many variations that are in accordance with the present teachings are possible and remain within the scope of the appended claims. The embodiments therefore are not to be restricted except within the scope of the appended claims.

The invention claimed is:

1. A surface acoustic wave (SAW) device, comprising:
    a base substrate, comprising silicon or sapphire;
    an acoustic wave absorbing layer disposed on the base substrate;
    a piezo-electric material layer disposed on the acoustic wave absorbing layer, the piezo-electric material layer comprising LiNbO3 or LiTaO3; and
    at least one interdigitated electrode pair disposed on the piezo-electric material layer, the at least one interdigitated electrode pair comprising an electrically conductive material;
    an undoped silicon glass (USG) layer disposed: between the at least one interdigitated electrode pair and the piezo-electric material layer; or on the at least one interdigitated electrode pair and the piezo-electric material layer,
    wherein the acoustic wave absorbing layer comprises a material having properties to substantially trap within the acoustic wave absorbing layer an acoustic wave propagating in a direction from the piezo-electric material layer to the base substrate.

2. The device of claim 1, wherein the piezo-electric material layer has a first shear velocity, and the base substrate has a second shear velocity, and the acoustic wave absorbing layer has a third shear velocity which is less than the first shear velocity and less than the second shear velocity.

3. The SAW device of claim 1, wherein the acoustic wave absorbing layer comprises a dielectric layer.

4. The SAW device of claim 1, wherein the acoustic wave absorbing layer comprises at least one of a silicon low-k resin and carbon doped silicon oxide.

5. A surface acoustic wave (SAW) device, comprising:
    a base substrate;
    a piezo-electric material layer;
    at least one interdigitated electrode pair disposed on the piezo-electric material layer; and
    an acoustic wave suppression layer disposed between the piezo-electric material layer and the base substrate, the acoustic wave suppression layer being a doped piezo-electric material layer, which is doped with an impurity that causes a viscous loss to the surface acoustic wave propagating in a direction from the piezo-electric material layer to the base substrate, wherein the acoustic wave suppression layer is configured to suppress an acoustic wave propagating in a direction from the piezo-electric material layer to the base substrate.

6. The SAW device of claim 5, wherein the acoustic wave suppression layer comprises at least one of a silicon low-k resin and carbon doped silicon oxide.

7. The SAW device of claim 1, wherein the base substrate comprises one of a silicon base substrate or a sapphire base substrate.

8. The SAW device of claim 1, further comprising a temperature compensating material layer disposed: between the at least one interdigitated electrode pair and the piezo-electric material layer, or on the at least one interdigitated electrode pair and the piezo-electric material layer.

9. The SAW device of claim 5, wherein the acoustic wave suppression layer comprises a dielectric layer.

10. The SAW device of claim 9, wherein the impurity comprises hydrogen or oxygen.

11. The SAW device of claim 9, wherein the piezo-electric material layer has a first shear velocity, and the base substrate has a second shear velocity, and the acoustic wave suppression layer has a third shear velocity which is less than the first shear velocity and less than the second shear velocity.

12. The SAW device of claim 9, wherein the base substrate comprises one of a silicon base substrate or a sapphire base substrate.

13. The SAW device of claim 9, wherein the piezo-electric material layer comprises one of $LiNbO3$ or $LiTaO3$.

14. The SAW device of claim 9, further comprising a temperature compensating material layer disposed: between the at least one interdigitated electrode pair and the piezo-electric material layer, or on the at least one interdigitated electrode pair and the piezo-electric material layer.

* * * * *